United States Patent
Lim et al.

(10) Patent No.: US 6,531,386 B1
(45) Date of Patent: Mar. 11, 2003

(54) METHOD TO FABRICATE DISH-FREE COPPER INTERCONNECTS

(75) Inventors: Victor Seng-Keong Lim, Singapore (SG); Simon Chooi, Singapore (SG); Randall Cha, Singapore (SG)

(73) Assignee: Chartered Semiconductor Manufacturing Ltd.

( * ) Notice: Subject to any disclaimer, the term of this patent is extended or adjusted under 35 U.S.C. 154(b) by 0 days.

(21) Appl. No.: 10/072,107

(22) Filed: Feb. 8, 2002

(51) Int. Cl.$^7$ ............... H01L 21/4763; H01L 21/44
(52) U.S. Cl. ............. 438/631; 438/634; 438/639; 438/669; 438/675
(58) Field of Search ............... 438/631, 634, 438/639, 669, 675

(56) References Cited

U.S. PATENT DOCUMENTS

| | | | |
|---|---|---|---|
| 5,660,706 A | * 8/1997 | Zhao et al. | 205/123 |
| 5,928,791 A | * 7/1999 | Rosenmayer | 428/421 |
| 6,180,523 B1 | 1/2001 | Lee et al. | 438/678 |
| 6,184,138 B1 | 2/2001 | Ho et al. | 438/687 |
| 6,225,223 B1 | 5/2001 | Liu et al. | 438/687 |
| 6,415,973 B1 | * 7/2002 | Ho et al. | 228/180.5 |
| 2001/0027013 A1 | * 10/2001 | Tsutsui | 438/674 |
| 2001/0036724 A1 | * 11/2001 | Ahn | 438/623 |
| 2001/0040294 A1 | * 11/2001 | Hawker et al. | 257/758 |
| 2002/0001950 A1 | * 1/2002 | Kim | 438/687 |
| 2002/0016061 A1 | * 2/2002 | Pyo | 438/639 |
| 2002/0094673 A1 | * 7/2002 | Dubin | 438/626 |
| 2002/0148720 A1 | * 10/2002 | Arena-Foster et al. | 204/192.12 |
| 2002/0151159 A9 | * 10/2002 | Vaartstra | 438/584 |
| 2002/0151161 A1 | * 10/2002 | Furusawa | 438/597 |
| 2002/0167089 A1 | * 11/2002 | Ahn et al. | 257/762 |

OTHER PUBLICATIONS

Murakami et al., "Spin–on Cu Films for ULSI Metallization", American Vacuum Society, 1st Int'l Conf. on microelectronics and interfaces, Feb. 1–11, 2001, Santa Clara, CA Convention Center.
Rosenmayer et al., "An Oxide Cap Process for a PTFE–Based IC Dielectric," IEEE, 1998.

* cited by examiner

Primary Examiner—Amir Zarabian
Assistant Examiner—Judith A. Cothorn
(74) Attorney, Agent, or Firm—George O. Saile; Rosemary L. S. Pike; Stephen G. Stanton

(57) ABSTRACT

A method of fabricating at least one metal interconnect including the following steps. A structure having at least one exposed conductive structure is provided. A non-stick material layer is formed over the structure and the at least one exposed conductive structure. The non-stick material layer having an upper surface. The non-stick material layer is patterned to form a patterned non-stick material layer having at least one trench therethrough exposing at least a portion of the at least one conductive structure. A metal interconnect is formed in contact with the exposed portion of the at least one conductive structure within the at least one trench wherein the non-stick properties of the patterned non-stick material layer prevent accumulation of the metal comprising the metal interconnect upon the patterned upper surface of the patterned non-stick material layer. The at least one metal interconnect having an upper surface. The patterned non-stick material layer is removed. A planarized dielectric layer is formed over the structure exposing the upper surface of the at least one metal interconnect.

45 Claims, 3 Drawing Sheets

METHOD TO FABRICATE DISH-FREE COPPER INTERCONNECTS

The present invention relates generally to fabrication of semiconductor devices, and more specifically to fabrication of metal interconnects used with semiconductor devices.

BACKGROUND OF THE INVENTION

Currently, the fabrication of each copper damascene level or layer requires three chemical mechanical planarization (CMP) steps with two different slurries. This copper fabrication process is complex and costly since two end-point detectors and two different slurries are needed. Further, dishing usually occurs in the copper interconnects during the second CMP step which removes the TaN etch stop layer. This is mainly due to the fact that TaN is harder and more inert compared to copper, thus dishing of the copper lines is inevitable.

U.S. Pat. No. 6,225,223 B1 to Liu et al. describes a selective copper interconnect process.

U.S. Pat. No. 6,184,138 B1 to Ho et al. describes a selective electroless copper plating process using a cap layer 18.

U.S. Pat. No. 6,180,523 B1 to Lee et al. describes another selective copper interconnect formed over an underlying copper interconnect including a barrier layer 46.

The Murakami et al. article entitled "Spin-on Cu Films for ULSI Metallization," American Vacuum Society, $1^{st}$ International Conference on micro-electronics and interfaces, Feb. 7 to 11, 2001, Santa Clara, California Convention Center, describes a spin-on copper (Cu) process.

The Rosenmayer et al. article entitled "An Oxide Cap Process for a PTFE-based IC Dielectric," IEEE, 1998 describes a spin-on copper process to fill trenches and vias down to 0.3 μm.

SUMMARY OF THE INVENTION

Accordingly, it is an object of one or more embodiments of the present invention to provide an improved damascene process.

Other objects will appear hereinafter.

It has now been discovered that the above and other objects of the present invention may be accomplished in the following manner. Specifically, a structure having at least one exposed conductive structure is provided. A non-stick material layer is formed over the structure and the at least one exposed conductive structure. The non-stick material layer having an upper surface. The non-stick material layer is patterned to form a patterned non-stick material layer having at least one trench therethrough exposing at least a portion of the at least one conductive structure. A metal interconnect is formed in contact with the exposed portion of the at least one conductive structure within the at least one trench wherein the non-stick properties of the patterned non-stick material layer prevent accumulation of the metal comprising the metal interconnect upon the patterned upper surface of the patterned non-stick material layer. The at least one metal interconnect having an upper surface. The patterned non-stick material layer is removed. A planarized dielectric layer is formed over the structure exposing the upper surface of the at least one metal interconnect.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Initial Structure

Figure 1:
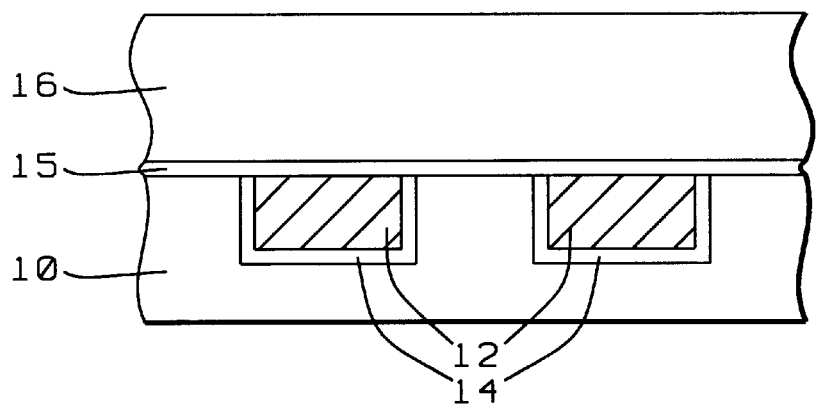
FIGS. 1 to 8 schematically illustrate in cross-sectional representation a preferred embodiment of the present invention.

FIG. 1 illustrates a cross-sectional view of a structure 10 having exposed conductive structures 12 formed therein. Conductive structures 12 may be metal plugs or lines, for example, and may include respective metal barrier layers 14 as shown in the figures. Conductive structures 12 are preferably comprised of copper (Cu), aluminum (Al), tungsten (W), gold (Au), silver (Ag), an aluminum alloy (for example an AlCu alloy) or a copper alloy (for example a CuIn alloy) and are more preferably comprised of copper. Conductive structures 12 will be considered to be copper lines 12 for ease of illustration hereafter.

Structure 10 is preferably a silicon substrate and is understood to possibly include a semiconductor wafer or substrate, active and passive devices formed within the wafer, conductive layers and dielectric layers (e.g., inter-poly oxide (IPO), tungsten plugs, metal lines, damascene interconnects, and an intermetal dielectric (IMD), etc.) formed over the wafer surface. The term "semiconductor structure" is meant to include devices formed within a semiconductor wafer and the layers overlying the wafer.

It is noted that there is no bottom barrier layer formed upon the exposed copper lines 12 as opposed to having, for example, a TaN bottom barrier layer over the exposed copper lines 12.

An etch stop layer 15 is formed over structure 10 and the exposed copper lines 12 to a thickness of preferably from about 50 to 5000 Å and more preferably from about 200 to 1500 Å. Etch stop layer 15 is preferably comprised of silicon nitride (SiN), silicon oxide ($SiO_2$), silicon oxynitride (SiON) or silicon carbide (SiC) and is more preferably comprised of silicon nitride (SiN).

Key Step of the Invention

In a key step of the invention, a non-stick material layer 16 is formed over SiN etch stop layer 15 to a thickness of preferably from about 1000 to 10,000 Å and more preferably from about 3000 to 9000 Å. Non-stick material layer 16 is comprised of, but not restricted to, PTFE or any other non-stick dielectric material and is more preferably comprised of PTFE having a thickness of preferably from about 1000 to 10,000 Å and more preferably from about 3000 to 8000 Å. Non-stick material layer 16 will be considered to be a PTFE layer 16 for ease of illustration hereafter.

Formation of Trenches 18 Within PTFE Layer 16

Figure 2:
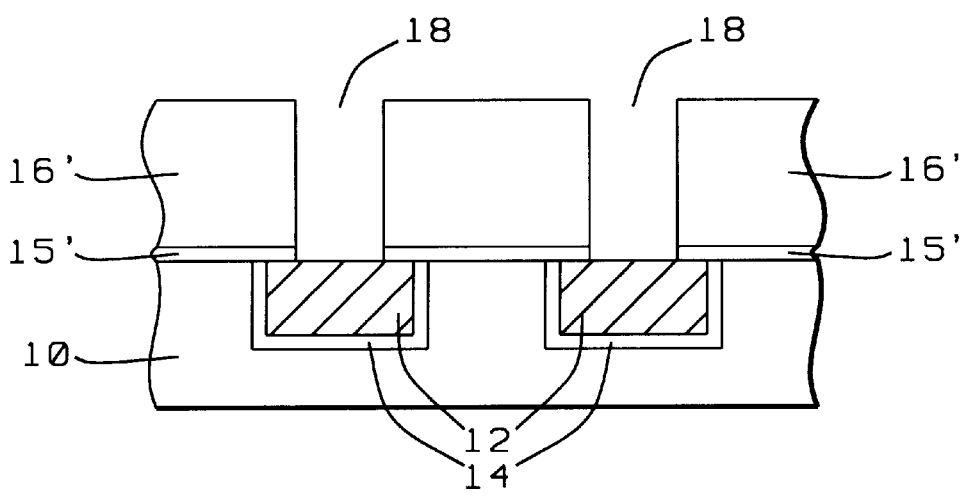

As shown in FIG. 2, PTFE layer 16 and SiN etch stop layer 15 are patterned to form trenches 18 respectively exposing at least a portion of copper lines 12. PTFE layer 16 is preferably etched by a plasma-assisted etching process that can also remove any unwanted copper oxide from over copper lines 12 and preferably using one or more of the following gases: $N_2$, $H_2$, ammonia, $O_2$, forming gas ($N_2/H_2$), a fluorocarbon, a fluorine-substituted hydrocarbon, a hydrocarbon, argon (Ar), helium (He), $BCl_3$, $NF_3$ and chlorine.

A cleaning step may then be implemented to remove any etching residue. Such a cleaning step may employ chemicals including solvents and gases.

Spin-on Process to Form Metal Plugs/Interconnects 20

Figure 3:
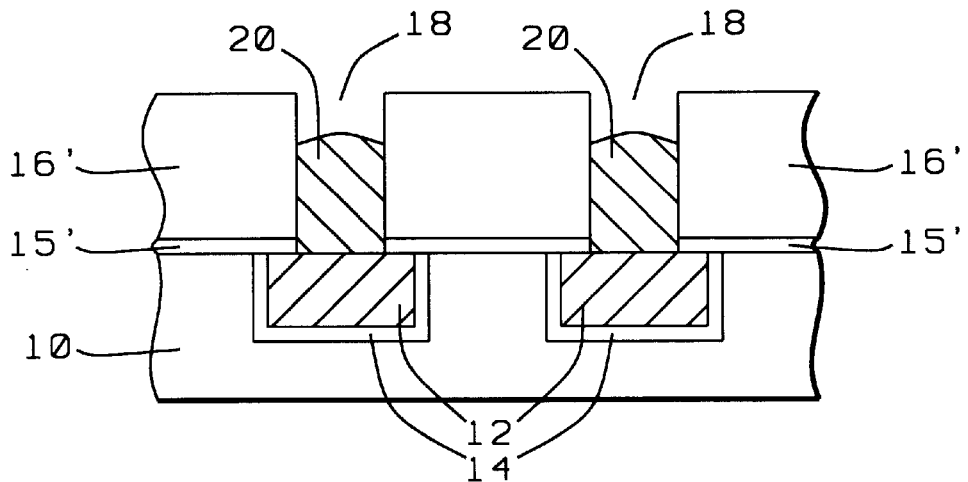

As shown in FIG. 3, using a spin-on process, a metal is deposited into trenches 18 over exposed Cu lines 12 to a thickness of preferably from about 1000 to 10,000 Å and more preferably from about 2000 to 8000 Å and preferably below the top of the patterned PTFE layer 16' to form plugs/lines/interconnects 20. Metal plugs 20 are preferably comprised of copper, aluminum, tungsten, gold, silver, an aluminum alloy or a copper alloy and are more preferably comprised of copper and are formed by a spin-on copper process. Metal plugs/interconnects 20 will be considered to be copper plugs/interconnects 20 formed by a spin-on copper process for ease of illustration hereafter.

Due to the non-stick nature of patterned PTFE layer 16' the copper solution will be confined inside trenches 18 during the spin-on copper (Cu) process and leaving the top surface of patterned PTFE layer 16' essentially free of the copper solution. Thus, selective copper deposition is achieved. To eliminate copper residue left on the top surface of patterned PTFE layer 16', the thickness or height of the patterned PTFE layer 16' is preferably higher than the actual thickness or height of copper plugs 20 (see above).

Removal of Patterned PTFE Layer 16'

Figure 4:
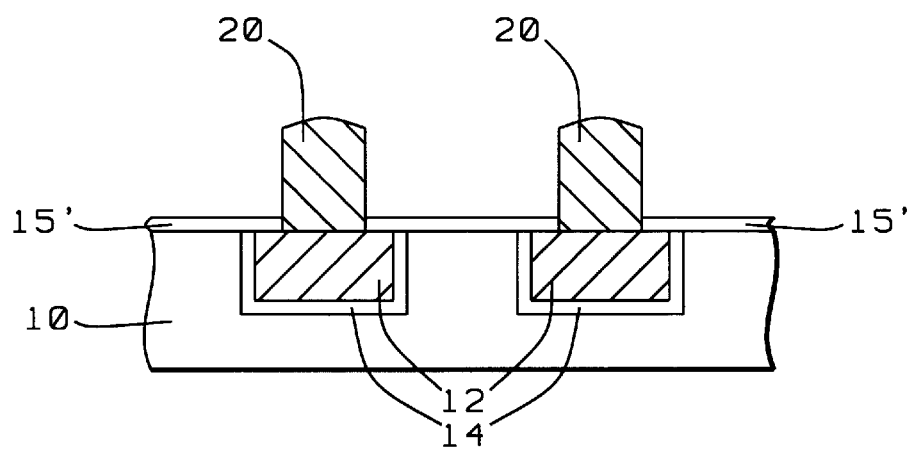

As shown in FIG. 4, the patterned PTFE layer 16' is removed to expose Cu plugs 20 and patterned SiN etch stop layer 15' preferably using the same plasma-assisted etching process used to form trenches 18 with parameters used to implement strict end point detection to avoid removal of the patterned SiN etch stop layer 15'. It is noted that the SiN etch stop layer 15' adjacent Cu plugs 20 passivate the edge of the Cu plugs 20. The SiN etch stop layer 15' also serves as a diffusion barrier.

Deposition of Barrier Layer 22

Figure 5:
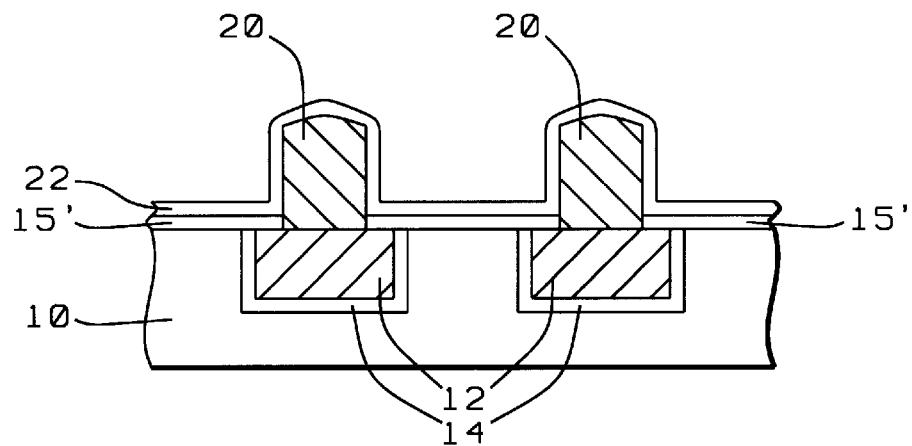

As shown in FIG. 5, a barrier layer 22 is formed over the exposed copper plugs 20 and patterned SiN etch stop layer 15' to a thickness of preferably from about 80 to 4000 Å and more preferably from about 200 to 800 Å. Barrier layer 22 is preferably formed of TaN, Ta, Ta/TaN, TiN or any other material capable of acting as a diffusion barrier and is more preferably comprised of TaN, Ta or Ta/TaN.

Again, it is noted that there is no barrier layer between copper lines 12 and copper plugs 20 which provides for improved electro-migration properties.

Selective Removal of Barrier Layer 22

Figure 6:
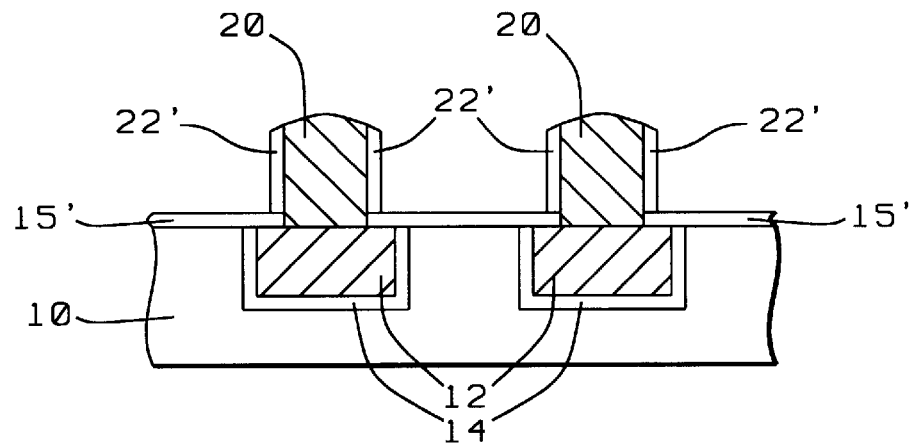

As shown in FIG. 6, barrier layer 22 is selectively removed form copper plugs 20 and patterned SiN etch stop layer 15' to leave only sidewall barrier layer portions 22' over the side walls of copper plugs 20. Barrier layer 22 is selectively removed preferably using a spacer etch technique, that is an anisotropic etching process that removes only horizontal portions of barrier layer 22.

Deposition of Dielectric Layer 24

Figure 7:
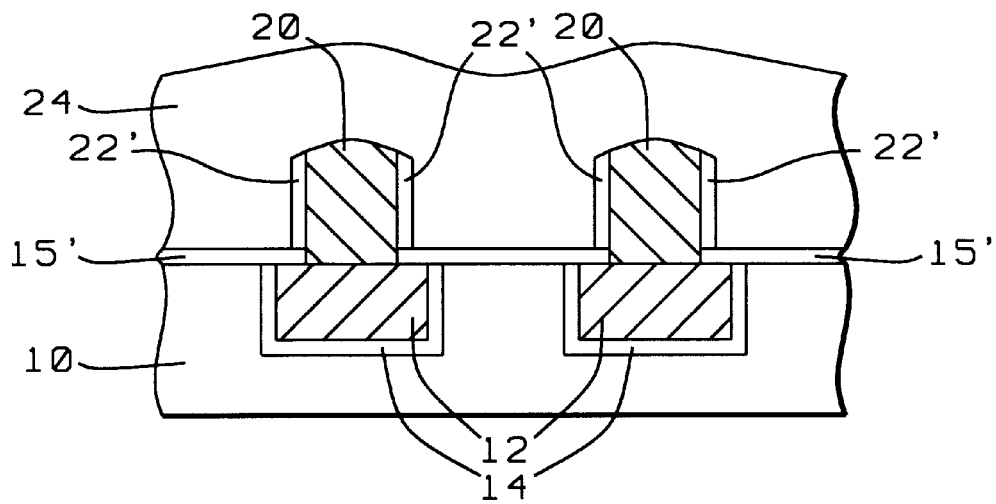

As shown in FIG. 7, a dielectric layer 24 is formed over the structure at least as high as copper plugs 20 and preferably covering copper plugs 20 and to a thickness of from about 3000 to 20,000 Å and more preferably from about 4000 to 16,000 Å above copper plugs 20. Dielectric layer 24 is preferably a low-k dielectric layer comprised of doped silicon oxide (e.g. fluorine-doped silicon oxide), fluorinated silica glass (FSG), $SiO_2$, Coral™, SiLK™ (from Dow Corning) or another low-k dielectric material and is more preferably comprised of fluorine-doped silicon oxide or FSG.

Planarization of Dielectric Layer 24

Figure 8:
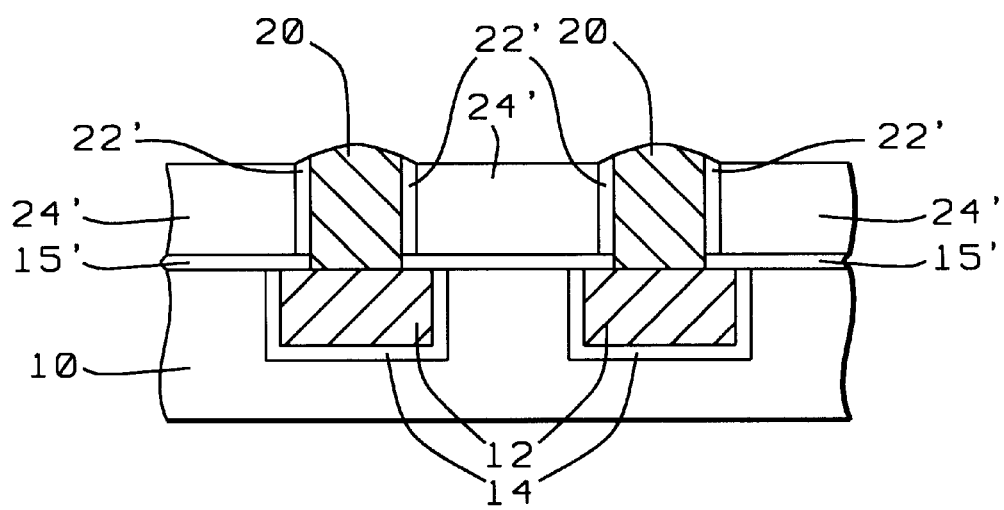

As shown in FIG. 8, dielectric layer 24 is planarized to form planarized dielectric layer 24' exposing copper plugs 20 and not contacting the copper of copper plugs 20. Sidewall barrier layer portions 22' prevent interaction between copper plugs 20 and planarized dielectric layer 24'. Dielectric layer 24 may be planarized by chemical mechanical polishing (CMP), for example.

Further processing may then proceed.

The method of the present invention does not suffer dishing of the copper plugs 20 during planarization of dielectric layer 24 and that this is the only planarization step required for each metal layer. Even if copper plugs 20 are dished, the recessed region will be filled by the next inter-metal dielectric (IMD) layer deposition as there is no Ta/TaN layer that must be removed by a CMP process. The CMP process is much simpler and dishing of copper plugs 20 or IMD layer 24' is not severe as CMP removal selectivity between Cu and the IMD layer 24 is low.

Further, it has been reported that copper interconnects (copper plugs 20) without a bottom barrier layer such as TaN such as in the present invention, have better EM performance and lower interconnect resistance.

Advantages of the Invention

The advantages of one or more embodiments of the present invention include:

1) better electro-migration (EM) performance and lower interconnect resistance;
2) selective deposition of Cu using spin-on copper;
3) much simpler CMP process, i.e. only require one step dielectric layer CMP and stop on copper plugs—the conventional CMP damascene process requires three steps, namely: step one—bulk copper CMP and stop on Ta/TaN barrier layer; step two—Ta/TaN barrier layer CMP and stop on dielectric layer; and step 3—buffing on dielectric; and
4) less prone to copper dishing which is otherwise inevitable during the second step of the conventional CMP damascene process (the Ta/TaN barrier layer CMP).

While particular embodiments of the present invention have been illustrated and described, it is not intended to limit the invention, except as defined by the following claims.

We claim:

1. A method of fabricating at least one metal interconnect, comprising the steps of:

providing a structure having at least one exposed conductive structure;

forming a non-stick material layer over the structure and the at least one exposed conductive structure; the non-stick material layer having an upper surface;

patterning the non-stick material layer to form a patterned non-stick material layer having at least one trench therethrough exposing at least a portion of the at least one conductive structure;

forming a metal interconnect in contact with the exposed portion of the at least one conductive structure within the at least one trench wherein the non-stick properties of the patterned non-stick material layer prevent accumulation of the metal comprising the metal interconnect upon the patterned upper surface of the patterned non-stick material layer; the at least one metal interconnect having an upper surface;

removing the patterned non-stick material layer; and forming a planarized dielectric layer over the structure exposing the upper surface of the at least one metal interconnect.

2. The method of claim 1, wherein the structure is a silicon substrate; the at least one conductive structure is comprised of a material selected from the group consisting of copper, aluminum, tungsten, gold, silver, an aluminum alloy and a copper alloy; the non-stick material layer is comprised of PFTE; the metal interconnect is comprised of a material selected from the group consisting of copper, aluminum, tungsten, gold, silver, an aluminum alloy and a copper alloy; and the planarized dielectric layer is comprised of a material selected from the group consisting of doped silicon oxide, FSG and $SiO_2$.

3. The method of claim 1, wherein the structure is a silicon substrate; the at least one conductive structure is comprised of copper; the metal interconnect is comprised of copper; and the planarized dielectric layer is comprised of FSG.

4. The method of claim 1, wherein the non-stick material layer is formed to a thickness of from about 1000 to 10,000 Å and the at least one metal interconnect is formed to a thickness of from about 1000 to 10,000 Å.

5. The method of claim 1, wherein the non-stick material layer is formed to a thickness of from about 3000 to 8000 Å and the at least one metal interconnect is formed to a thickness of from about 2000 to 8000 Å.

6. The method of claim 1, wherein the at least one metal interconnect has a height and the patterned non-stick material layer has a height wherein the metal interconnect height is less than the patterned non-stick material layer height; and wherein the upper surface of the at least one metal interconnect exposed through the planarized dielectric layer is non-dished.

7. The method of claim 1, wherein an etch stop layer is formed over the structure and the at least one exposed conductive structure before formation of the non-stick material layer, and the non-stick material layer is formed over the etch stop layer.

8. The method of claim 1, wherein an etch stop layer is formed over the structure and the at least one exposed conductive structure before formation of the non-stick material layer, and the non-stick material layer is formed over the etch stop layer; the etch stop layer being comprised of a material selected from the group consisting of silicon nitride, silicon oxide, silicon oxynitride and silicon carbide.

9. The method of claim 1, wherein an etch stop layer is formed over the structure and the at least one exposed conductive structure before formation of the non-stick material layer, and the non-stick material layer is formed over the etch stop layer; the etch stop layer being comprised of silicon nitride.

10. The method of claim 1, wherein the at least one conductive structure does not have a barrier layer formed thereupon.

11. The method of claim 1, wherein the non-stick material layer is patterned using a plasma-assisted etching process.

12. The method of claim 1, wherein the non-stick material layer is patterned using a plasma-assisted etching process which also removes any oxide formed over the exposed portion of the at least one conductive structure.

13. The method of claim 1, wherein the non-stick material layer is patterned using a plasma-assisted etching process using one or more gases selected from the group consisting of: $N_2$, $H_2$, ammonia, $O_2$, a fluorocarbon, a fluorine-substituted hydrocarbon, a hydrocarbon, argon, helium, $BCl_3$, $NF_3$ and chlorine.

14. The method of claim 1, wherein the non-stick material layer is patterned using a plasma-assisted etching process using one or more gasses selected from the group consisting of: $N_2$, $H_2$, ammonia and $O_2$.

15. The method of claim 1, wherein the patterned non-stick material layer is removed by the same process used to pattern the non-stick material layer.

16. The method of claim 1, wherein a barrier layer is formed over the structure and the at least one metal interconnect after the patterned non-stick material layer is removed and before the planarized dielectric layer is formed.

17. The method of claim 1, wherein the at least one metal interconnect has side walls and barrier layer portions are formed only over the at least one metal interconnect side walls after the patterned non-stick material layer is removed and before the planarized dielectric layer is formed.

18. A method of fabricating at least one copper interconnect, comprising the steps of:

providing a structure having at least one exposed conductive structure;

forming a non-stick PFTE layer over the structure and the at least one exposed conductive structure; the non-stick PFTE layer having an upper surface;

patterning the non-stick PFTE layer to form a patterned non-stick PFTE layer having at least one trench therethrough exposing at least a portion of the at least one conductive structure;

forming a copper interconnect in contact with the exposed portion of the at least one conductive structure within the at least one trench wherein the non-stick properties of the patterned non-stick PFTE layer prevent accumulation of the metal comprising the copper interconnect upon the patterned upper surface of the patterned non-stick PFTE layer; the at least one copper interconnect having an upper surface;

removing the patterned non-stick PFTE layer; and forming a planarized dielectric layer over the structure exposing the upper surface of the at least one copper interconnect.

19. The method of claim 18, wherein the structure is a silicon substrate; the at least one conductive structure is comprised of a material selected from the group consisting of copper, aluminum, tungsten, gold, silver, an aluminum alloy and a copper alloy; and the planarized dielectric layer is comprised of a material selected from the group consisting of doped silicon oxide, FSG and $SiO_2$.

20. The method of claim 18, wherein the structure is a silicon substrate; the at least one conductive structure is comprised of copper; and the planarized dielectric layer is comprised of FSG.

21. The method of claim 18, wherein the non-stick PFTE layer is formed to a thickness of from about 1000 to 10,000 Å and the at least one copper interconnect is formed to a thickness of from about 1000 to 10,000 Å.

22. The method of claim 18, wherein the non-stick PFTE layer is formed to a thickness of from about 3000 to 8000 Å and the at least one copper interconnect is formed to a thickness of from about 2000 to 8000 Å.

23. The method of claim 18, wherein the at least one copper interconnect has a height and the patterned non-stick PFTE layer has a height wherein the copper interconnect height is less than the patterned non-stick PFTE layer height; and wherein the upper surface of the at least one metal interconnect exposed through the planarized dielectric layer is non-dished.

24. The method of claim 18, wherein an etch stop layer is formed over the structure and the at least one exposed conductive structure before formation of the non-stick PFTE layer, and the non-stick PFTE layer is formed over the etch stop layer.

25. The method of claim 18, wherein an etch stop layer is formed over the structure and the at least one exposed conductive structure before formation of the non-stick PFTE layer, and the non-stick PFTE layer is formed over the etch stop layer; the etch stop layer being comprised of a material selected from the group consisting of silicon nitride, silicon oxide, silicon oxynitride and silicon carbide.

26. The method of claim 18, wherein an etch stop layer is formed over the structure and the at least one exposed conductive structure before formation of the non-stick PFTE layer, and the non-stick PFTE layer is formed over the etch stop layer; the etch stop layer being comprised of silicon nitride.

27. The method of claim 18, wherein the at least one conductive structure does not have a barrier layer formed thereupon.

28. The method of claim 18, wherein the non-stick PFTE layer is patterned using a plasma-assisted etching process.

29. The method of claim 18, wherein the non-stick PFTE layer is patterned using a plasma-assisted etching process which also removes any oxide formed over the exposed portion of the at least one conductive structure.

30. The method of claim 18, wherein the non-stick PFTE layer is patterned using a plasma-assisted etching process using one or more gasses selected from the group consisting of: $N_2$, $H_2$, ammonia, $O_2$ a fluorocarbon, a fluorine-substituted hydrocarbon, a hydrocarbon, argon, helium, $BCl_3$, $NF_3$ and chlorine.

31. The method of claim 18, wherein the non-stick PFTE layer is patterned using a plasma-assisted etching process using one or more gasses selected from the group consisting of: $N_2$, $H_2$, ammonia and $O_2$.

32. The method of claim 18, wherein the patterned non-stick PFTE layer is removed by the same process used to pattern the non-stick material layer.

33. The method of claim 18, wherein a barrier layer is formed over the structure and the at least one copper interconnect after the patterned non-stick PFTE layer is removed and before the planarized dielectric layer is formed.

34. The method of claim 18, wherein the at least one copper interconnect has side walls and barrier layer portions are formed only over the at least one copper interconnect side walls after the patterned non-stick PFTE layer is removed and before the planarized dielectric layer is formed.

35. A method of fabricating at least one copper interconnect, comprising the steps of:
providing a structure having at least one exposed conductive structure;
forming an etch stop layer upon the structure and upon the at least one exposed conductive structure;
forming a non-stick PFTE layer over the etch stop layer; the non-stick PFTE layer having an upper surface;
patterning the non-stick PFTE layer and the etch stop layer to form a patterned non-stick PFTE layer and a patterned etch stop layer having at least one trench therethrough exposing at least a portion of the at least one conductive structure;
forming a copper interconnect in contact with the exposed portion of the at least one conductive structure within the at least one trench wherein the non-stick properties of the patterned non-stick PFTE layer prevent accumulation of the metal comprising the copper interconnect upon the patterned upper surface of the patterned non-stick PFTE layer; the at least one copper interconnect having an upper surface and side walls;
removing the patterned non-stick PFTE layer;
forming barrier layer sidewall portions over the at least one copper interconnect side walls;
forming a planarized dielectric layer over the structure exposing the upper surface of the at least one copper interconnect; and wherein the upper surface of the at least one metal interconnect exposed through the planarized dielectric layer 24 is non-dished.

36. The method of claim 35, wherein the structure is a silicon substrate; the at least one conductive structure is comprised of a material selected from the group consisting of copper, aluminum, tungsten, gold, silver, an aluminum alloy and a copper alloy; the etch stop layer being comprised of a material selected from the group consisting of silicon nitride, silicon oxide, silicon oxynitride and silicon carbide; and the planarized dielectric layer is comprised of a material selected from the group consisting of doped silicon oxide, FSG and $SiO_2$.

37. The method of claim 35, wherein the structure is a silicon substrate; the at least one conductive structure is comprised of copper; the etch stop layer being comprised of silicon nitride and the planarized dielectric layer is comprised of FSG.

38. The method of claim 35, wherein the etch stop layer is formed to a thickness of from about 50 to 5000 Å; non-stick PFTE layer is formed to a thickness of from about 1000 to 10,000 Å and the at least one copper interconnect is formed to a thickness of from about 1000 to 10,000 Å.

39. The method of claim 35, wherein the etch stop layer is formed to a thickness of from about 200 to 1500 Å; the non-stick PFTE layer is formed to a thickness of from about 3000 to 8000 Å and the at least one copper interconnect is formed to a thickness of from about 2000 to 8000 Å.

40. The method of claim 35, wherein the at least one copper interconnect has a height and the patterned non-stick PFTE layer has a height wherein the copper interconnect height is less than the patterned non-stick PFTE layer height.

41. The method of claim 35, wherein the non-stick PFTE layer is patterned using a plasma-assisted etching process.

42. The method of claim 35, wherein the non-stick PFTE layer is patterned using a plasma-assisted etching process which also removes any oxide formed over the exposed portion of the at least one conductive structure.

43. The method of claim 35, wherein the non-stick PFTE layer is patterned using a plasma-assisted etching process using one or more gasses selected from the group consisting of: $N_2$, $H_2$, ammonia, $O_2$, a fluorocarbon, a fluorine-substituted hydrocarbon, a hydrocarbon, argon, helium, $BCl_3$, $NF_3$ and chlorine.

44. The method of claim 35, wherein the non-stick PFTE layer is patterned using a plasma-assisted etching process using one or more gasses selected from the group consisting of: $N_2$, $H_2$, ammonia and $O_2$.

45. The method of claim 35, wherein the patterned non-stick PFTE layer is removed by the same process used to pattern the non-stick PFTE layer.

* * * * *

UNITED STATES PATENT AND TRADEMARK OFFICE
CERTIFICATE OF CORRECTION

PATENT NO. : 6,531,386 B1
DATED : March 11, 2003
INVENTOR(S) : Victor Seng-Keong Lim, Simon Chooi and Randell Cha It is certified that error appears in the above-identified patent and that said Letters Patent is hereby corrected as shown below:

Column 5,
Line 3, delete "PFTE" and replace with -- PTFE --,

Column 6,
Lines 14, 16, 17, 18, 24, 27, 29, 44, 48, 54, 55, 61, 62 and 66, delete "PFTE" and replace with -- PTFE --, Column 7,
Lines 1, 7, 8, 14, 16, 20, 26, 31, 35, 40, 48, 49, 50, 51 and 58, delete "PFTE" and replace with -- PTFE --, Column 8,
Lines, 1, 3, 28, 33, 38, 39, 40, 42, 46, 52, 57 and 58, delete "PFTE" and replace with -- PTFE --.

Signed and Sealed this

Twelfth Day of August, 2003

JAMES E. ROGAN
*Director of the United States Patent and Trademark Office*